United States Patent
Murakami et al.

(10) Patent No.: US 10,011,111 B2
(45) Date of Patent: Jul. 3, 2018

(54) PIEZOELECTRIC FILM, PRODUCTION METHOD THEREOF, PIEZOELECTRIC ELEMENT, AND LIQUID DISCHARGE APPARATUS

(71) Applicant: FUJIFILM Corporation, Tokyo (JP)

(72) Inventors: Naoki Murakami, Kanagawa-ken (JP); Takami Arakawa, Kanagawa-ken (JP); Takamichi Fujii, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/439,564

(22) Filed: Feb. 22, 2017

(65) Prior Publication Data
US 2017/0157931 A1 Jun. 8, 2017

Related U.S. Application Data

(63) Continuation of application No. PCT/JP2015/003738, filed on Jul. 27, 2015.

(30) Foreign Application Priority Data
Aug. 29, 2014 (JP) .................................. 2014-174867

(51) Int. Cl.
*H01L 41/187* (2006.01)
*B41J 2/14* (2006.01)
(Continued)

(52) U.S. Cl.
CPC ......... *B41J 2/14209* (2013.01); *B41J 2/1607* (2013.01); *B41J 2/1646* (2013.01);
(Continued)

(58) Field of Classification Search
CPC .... B41J 2/14209; B41J 2/1607; B41J 2/1646; C23C 14/08; C23C 14/3471; H01L 41/047; H01L 41/183
(Continued)

(56) References Cited

U.S. PATENT DOCUMENTS 6,091,183 A * 7/2000 Nishimura ............ H01L 41/187
310/358
2004/0214352 A1 10/2004 Kijima et al.
(Continued)

FOREIGN PATENT DOCUMENTS

JP H07-048172 A 2/1995
JP 2005-101512 A 4/2005
(Continued)

OTHER PUBLICATIONS

International Search Report issued in PCT/JP2015/003738; dated Dec. 1, 2015.
(Continued)

*Primary Examiner* — Thomas Dougherty
(74) *Attorney, Agent, or Firm* — Studebaker & Brackett PC

(57) ABSTRACT

A piezoelectric film of the present invention is a piezoelectric film including a perovskite oxide represented by the following formula (P), in which crystal phases of the perovskite oxide include tetragonal crystals and rhombohedral crystals at a ratio that satisfies the following formula (1).

$$A_{1+\delta}[(Zr_xTi_{1-x})_{1-a}Nb_a]O_y \quad (P)$$

$$0.70 \leq \text{rhombohedral crystals}/(\text{rhombohedral crystals} + \text{tetragonal crystals}) \leq 0.95 \quad (1),$$

where, in the formula (P), A is an A-site element primarily containing Pb, and Zr, Ti, and Nb are B-site elements. x is equal to or higher than 0.4 and lower than 1, excluding x of equal to or higher than 0.51 and equal to or lower than 0.53. a is equal to or higher than 0.08.

5 Claims, 8 Drawing Sheets

(51) Int. Cl.
*B41J 2/16* (2006.01)
*C23C 14/34* (2006.01)
*C23C 14/08* (2006.01)
*H01L 41/047* (2006.01)
*H01L 41/18* (2006.01)
*C23C 14/00* (2006.01)
*H01L 41/00* (2013.01)

(52) U.S. Cl.
CPC .......... *C23C 14/08* (2013.01); *C23C 14/3471* (2013.01); *H01L 41/047* (2013.01); *H01L 41/183* (2013.01); *C23C 14/00* (2013.01); *H01L 41/00* (2013.01)

(58) Field of Classification Search
USPC ....... 310/358; 252/62.9 PZ, 62.9 R; 501/134
See application file for complete search history.

(56) References Cited

U.S. PATENT DOCUMENTS

2005/0167712 A1   8/2005   Kijima et al.
2011/0316393 A1   12/2011  Naono et al.
2011/0316937 A1   12/2011  Arakawa et al.
2016/0020381 A1*  1/2016   Arakawa ............... C04B 35/499
                                                        428/220

FOREIGN PATENT DOCUMENTS

| | | |
|---|---|---|
| JP | 2005-209722 A | 8/2005 |
| JP | 2008-270704 A | 11/2008 |
| JP | 2012-009677 A | 1/2012 |
| JP | 2012-009678 A | 1/2012 |
| JP | 2012-099636 A | 5/2012 |
| WO | 2012/165110 A1 | 12/2012 |

OTHER PUBLICATIONS

Written Opinion issued in PCT/JP2015/003738; dated Dec. 1, 2015.
An Office Action; "Decision of Refusal" issued by the Japanese Patent Office dated Feb. 6, 2018, which corresponds to Japanese Patent Application No. 2016-544923 and is related to U.S. Appl. No. 15/439,564; with English translation.
An Office Action; "Notice of Reasons for Rejection" issued by the Japanese Patent Office dated Aug. 22, 2017, which corresponds to Japanese Patent Application No. 2016-544923 and is related to U.S. Appl. No. 15/439,564; with English translation.

* cited by examiner

PIEZOELECTRIC FILM, PRODUCTION METHOD THEREOF, PIEZOELECTRIC ELEMENT, AND LIQUID DISCHARGE APPARATUS

CROSS REFERENCE TO RELATED APPLICATIONS

The present application is a Continuation of PCT International Application No. PCT/JP2015/003738 filed on Jul. 27, 2015, which claims priority under 35 U.S.C. § 119(a) to Japanese Patent Application No. 2014-174867 filed on Aug. 29, 2014. Each of the above applications is hereby expressly incorporated by reference, in its entirety, into the present application.

BACKGROUND OF THE INVENTION

1. Field of the Invention

The present invention relates to a lead zirconate titanate-based piezoelectric film, a production method thereof, a piezoelectric element using the piezoelectric film, and a liquid discharge apparatus.

2. Description of the Related Art

An actuator including an ink jet recording head is provided with a piezoelectric body having a piezoelectric property that expands and contracts with variation in applied electric field intensity, and a piezoelectric element provided with an electrode that applies an electric field to the piezoelectric body.

In recent years, in order to meet the demand for miniaturization of an apparatus, miniaturization of an actuator in cooperation with a semiconductor process technology such as a microelectromechanical systems (MEMS) technology has proceeded. In the semiconductor process technology, high-precision processing using film formation or photolithography becomes possible. Therefore, there has been actively conducted research on thinning of a piezoelectric body in an actuator.

As a piezoelectric material having high piezoelectric properties, a lead zirconate titanate (PZT)-based perovskite oxide has been widely used due to its performance. It is known that when a PZT-based perovskite oxide piezoelectric film has a morphotropic phase boundary (MPB) composition in which Zr:Ti is near 52:48, the piezoelectric constant and the electromechanical coupling coefficient thereof become maximum, which is appropriate for actuator applications.

In JP2012-99636A, it is described that in a piezoelectric element provided with a piezoelectric thin film having a laminate of a lead titanate layer and a lead zirconate layer, which have columnar structures, the compositions of lead titanate and lead zirconate in the piezoelectric thin film are caused to be MPB compositions, thereby improving piezoelectric properties.

On the other hand, as a technique for improving piezoelectric properties using a method other than that for the formation of the MPB compositions, a PZT-based piezoelectric film is doped with various donor ions having higher valences than those of substituted ions. Since the ionic valence of Zr and Ti in B-site is 4, as donor ions that substitute for B-site elements, B-site elements having an ionic valence of 5 or higher, such as V, Nb, Ta, Sb, Mo, and W have been used.

For example, in JP1995-48172A (JP-H07-48172A), a composition for a PZT-based actuator, in which A-site of PZT is doped with Sr, Ba, and/or La and B-site is doped with Sb or Nb, resulting in a composition closer to a rhombohedron side than a MPB composition. In JP1995-48172A (JP-H07-48172A), it is described that a laminated actuator which uses a rhombohedral crystal system PZT-based composition has excellent characteristics and causes a low degree of deterioration in displacement characteristics in durable use.

Attempts on donor ion doping have been examined in thin film applications. In JP2005-209722A, it is described that in order to dope a PZT-based ferroelectric film with Nb as B-site ions at a high concentration, at least one of Si, Ge, and Sn is added as A-site ions. In JP2005-209722A, compensation ions added to the A-site are a sintering aid for obtaining a thermal equilibrium state by accelerating sintering in a thermal equilibrium process by a sol-gel method, and are necessary for suppressing an increase in crystallization temperature due to the Nb doping. However, when the sintering aid is added, piezoelectric properties deteriorate, and the effect of the addition of donor ions cannot be sufficiently exhibited.

An attempt to dope PZT with Nb at a high concentration has been reported by the inventors. In JP2008-270704A, an Nb-doped PZT film in which the effect of the addition of donor ions is significantly exhibited by controlling film formation conditions in a non-thermal-equilibrium process is described. In JP2008-270704A, the production of the Nb-doped PZT film having a MPB composition succeeded.

SUMMARY OF THE INVENTION

However, for a further reduction in thickness, further improvement in piezoelectric properties and long-term reliability of piezoelectric properties are required for a piezoelectric film.

The present invention has been made taking the foregoing circumstances into consideration, and an object thereof is to provide a Nb-doped PZT-based piezoelectric film which has high piezoelectric properties and causes a low degree of deterioration in piezoelectric properties during long-term operation, a production method thereof, a piezoelectric element using the piezoelectric film, and a liquid discharge apparatus.

A piezoelectric film of the present invention is a piezoelectric film comprising: a perovskite oxide represented by the following formula (P), in which crystal phases of the perovskite oxide include tetragonal crystals and rhombohedral crystals at a ratio that satisfies the following formula (1),

$$A_{1+\delta}[(Zr_xTi_{1-x})_{1-a}Nb_a]O_y \quad (P)$$

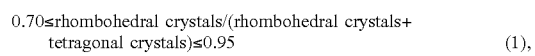

$$0.70 \leq \text{rhombohedral crystals}/(\text{rhombohedral crystals} + \text{tetragonal crystals}) \leq 0.95 \quad (1),$$

where, in the formula (P), A is an A-site element primarily containing Pb, and Zr, Ti, and Nb are B-site elements. x is equal to or higher than 0.4 and lower than 1 (excluding 0.51≤x≤0.53), and a is equal to or higher than 0.08. Although δ=0 and y=3 are standard, δ and y may deviate from standard values in a range in which a perovskite structure is capable of being obtained.

In addition, in the formula (1), a value represented by rhombohedral crystals/(rhombohedral crystals+tetragonal crystals) represents the ratio of rhombohedral crystals to the crystal phases (rhombohedral crystals+tetragonal crystals) of the perovskite oxide. The amount of each of the crystal phases in PZT is evaluated by the peak surface area of each of the crystal phases obtained through high-resolution X-ray diffraction (high-resolution XRD) of the piezoelectric film.

The amount of the rhombohedral crystals is determined by a value of the peak surface area of diffraction peaks of the rhombohedral crystals, and the amount of the tetragonal crystals is determined by a value of the sum of the peak surface areas of diffraction peaks of a axis-oriented tetragonal crystals and c axis-oriented tetragonal crystals. FIG. 6 shows XRD spectrums of peak splitting of perovskite type (200)-oriented peaks obtained through high-resolution XRD. Peak splitting is performed by performing peak detection through fitting using a pseudo-Voigt function.

In this specification, "A is an A-site element primarily containing Pb" means that a component in a proportion of 90 mol % or more in the A-site element A is Pb.

In the general formula (P), x representing the proportion of Zr when the sum of Zr and Ti is assumed to be 1 is preferably 0.4 or higher and lower than 1 (excluding $0.51 \leq x \leq 0.53$) and is higher than 0.5. In the general formula (P), the excluded valve of x, $0.51 \leq x \leq 0.53$, is a MPB composition. That is, in the piezoelectric film of the present invention, in a composition region excluding the MPB composition, rhombohedral crystals and tetragonal crystals coexist with each other.

It is preferable that the piezoelectric film of the present invention is a columnar crystal film consisting of a number of columnar crystals.

The piezoelectric film of the present invention can be produced by a production method of the piezoelectric film of the present invention described below. The production method of the piezoelectric film of the present invention is a production method of a piezoelectric film including a perovskite oxide represented by the following formula (Q), on a substrate by a sputtering method using a plasma, in which a first production method is to perform film formation using a single target in the sputtering method under conditions in which a temperature Ts of the substrate during the film formation satisfies the following formula (2), and a power density D on the target satisfies the following formula (4), and a second production method is to perform film formation using two targets in the sputtering method under conditions in which a temperature Ts of the substrate during the film formation satisfies the following formula (2), and a power density D on the targets satisfies the following formula (5), $$A_{1+\delta}[(Zr_xTi_{1-x})_{1-a}Nb_a]O_y \quad (Q),$$

$$400 < Ts(°C.) < 750 \quad (2),$$

$$3.0 \leq D(W/cm^2) \leq 4.0 \quad (4),$$

$$3.0 \leq D(W/cm^2) \leq 6.0 \quad (5),$$

where in the formula (Q), A is an A-site element primarily containing Pb, and Zr, Ti, and Nb are B-site elements. x is equal to or higher than 0.4 and lower than 1 (excluding $0.51 \leq x \leq 0.53$), and a is equal to or higher than 0.08. Although $\delta=0$ and $y=3$ are standard, $\delta$ and $y$ may deviate from the standard values in a range in which a perovskite structure is capable of being obtained.

In the first and second production methods, it is preferable that the substrate temperature Ts satisfies $450 \leq Ts (°C.) \leq 650$.

In this specification, "film formation temperature Ts (° C.)" means the temperature of a center portion on the substrate surface on which the film formation is performed.

In this specification, "a power density D on a target" means a power density on a sputtering surface of a target. The power density is a value obtained by dividing film formation power during sputtering by the surface area of the target.

A piezoelectric element of the present invention comprises: the piezoelectric film of the present invention; and an electrode which applies an electric field to the piezoelectric film.

A liquid discharge apparatus comprises: the piezoelectric element of the present invention; and a liquid discharge member which is provided integrally with or separately from the piezoelectric element, in which the liquid discharge member has a liquid storage chamber which stores a liquid, and a liquid discharge port through which the liquid is discharged from the liquid storage chamber to the outside.

The piezoelectric film of the present invention is a Nb-doped PZT-based piezoelectric film, and in a composition region other than the MPB composition, rhombohedral crystals and tetragonal crystals coexist with each other at a ratio in a range of $0.70 \leq$ rhombohedral crystals/(rhombohedral crystals+tetragonal crystals)$\leq 0.95$. In this configuration, a Nb-doped PZT-based piezoelectric film which has high piezoelectric properties and causes a low degree of deterioration in piezoelectric properties during long-term operation can be obtained.

DESCRIPTION OF THE PREFERRED EMBODIMENTS

Figure 1A:
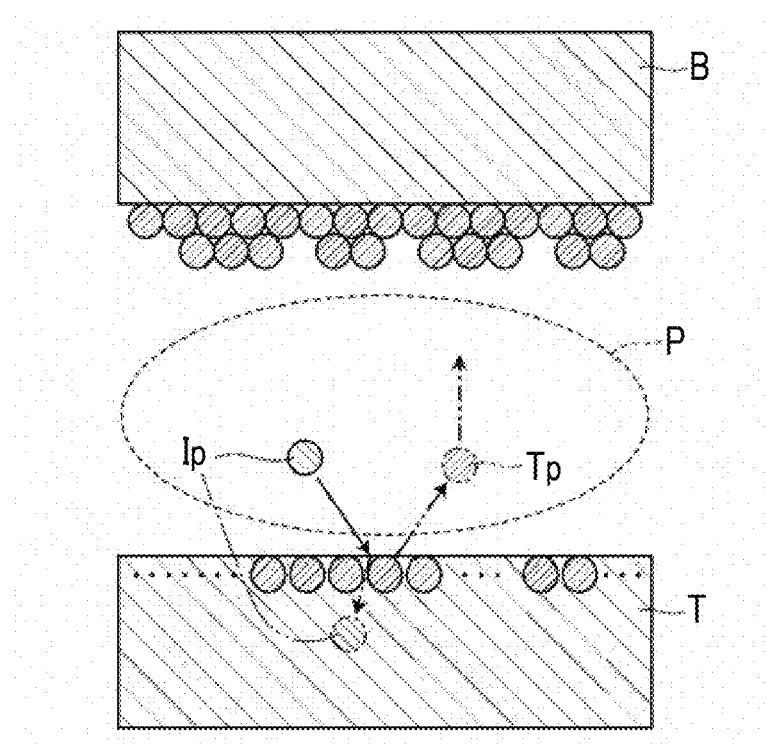
FIG. 1A is a view schematically illustrating a form during sputtering film formation.

As described in "Description of the Related Art", it is known that in a piezoelectric film having a morphotropic phase boundary (MPB) composition in which Zr:Ti is near 52:48 ($0.51 \leq Zr/(Zr+Ti) \leq 0.53$) in a PZT-based perovskite oxide, the piezoelectric constant and the electromechanical coupling coefficient thereof become maximum, which is appropriate for actuator applications. In JP2008-270704A, it is described that a piezoelectric film with high characteristics in which a piezoelectric constant $d_{31}$ measured by a cantilever is 250 pm/V in a Nb-doped PZT film having such a composition is obtained.

The inventors have conducted extensive studies on production conditions in a sputtering method to achieve a further increase in characteristics and obtain a piezoelectric film that causes a low degree of deterioration in piezoelectric properties during long-term operation. The inventors have focused on high piezoelectric properties in a MPB composition and excellent characteristics and long-term operation stability in a rhombohedral crystal-based PZT actuator, and have conducted studies on the possibility of Nb-doped PZT which is rhombohedral crystal-rich and contains tetragonal crystals that coexist therewith.

It is known that PZT is mixed crystal in which lead titanate ($PbTiO_3(PT)$) of which the most stable crystal phase is tetragonal and lead zirconate ($PbZrO_3(PZ)$) of which the most stable crystal phase is rhombohedral are mixed with each other and typically, tetragonal crystals are formed in a lead titanate-rich composition and rhombohedral crystals are formed in a lead zirconate-rich composition with respect to a MPB composition as a boundary. That is, in PZT, tetragonal crystals and rhombohedral crystals coexist with each other typically only in the vicinity of the MPB composition, and it is difficult to control the ratio between the tetragonal crystals and the rhombohedral crystals in the MPB composition.

The inventors have focused on the fact that during film formation according to a sputtering method, Zr and Ti become more likely to be mixed with each other as a power density on a target increases, and thought that by forming a film of Nb-doped PZT under conditions in which the power density on the target is set so as to cause Zr and Ti to be less likely to be mixed with each other, PT and PZ are unevenly distributed in the film such that tetragonal crystals and rhombohedral crystals coexist with each other even in compositions other than the MPB composition.

As a result, by using a target with a low void volume and causing the power density $D(W/cm^2)$ on the target to be under specific conditions lower than a typical value, obtaining a piezoelectric film in which rhombohedral crystals and tetragonal crystals coexist with each other to correspond to the compositional ratio between Zr and Ti even not in the vicinity of the MPB composition succeeded.

Furthermore, it was found that in a Nb-doped PZT film in which rhombohedral crystals and tetragonal crystals coexist with each other at a ratio in a range of $0.70 \leq$ rhombohedral crystals/(rhombohedral crystals+tetragonal crystals)$\leq 0.95$, which is obtained by the production method, a piezoelectric film which has high piezoelectric properties and causes a low degree of deterioration in piezoelectric properties during long-term operation even in compositions other than a MPB composition can be obtained.

That is, a piezoelectric film of the present invention is a piezoelectric film including a perovskite oxide represented by the following formula (P), in which the crystal phases of the perovskite oxide include tetragonal crystals and rhombohedral crystals at a ratio that satisfies the following formula (1).

$$0.70 \leq \text{rhombohedral crystals/(rhombohedral crystals+ tetragonal crystals)} \leq 0.95 \quad (1),$$

where, in the formula (P), A is an A-site element primarily containing Pb, and Zr, Ti, and Nb are B-site elements. x is equal to or higher than 0.4 and lower than 1 (excluding $0.51 \leq x \leq 0.53$), and a is equal to or higher than 0.08. Although $\delta=0$ and $y=3$ are standard, $\delta$ and y may deviate from the standard values in a range in which a perovskite structure is capable of being obtained.

In addition, a production method of the piezoelectric film of the present invention is a production method of a piezoelectric film consisting of a perovskite oxide represented by the following formula (Q) by a sputtering method using a plasma on a substrate, in which a first production method is to perform film formation using a single target under conditions in which a temperature Ts of the substrate during the film formation satisfies the following formula (2), and a power density D on the target satisfies the following formula (4), and a second production method is to perform film formation using two targets under conditions in which a temperature Ts of the substrate during the film formation satisfies the following formula (2), and a power density D on the targets satisfies the following formula (5).

$$400 < Ts(°C.) < 750 \quad (2),$$

$$3.0 \leq D(W/cm^2) \leq 4.0 \quad (4),$$

$$3.0 \leq D(W/cm^2) \leq 6.0 \quad (5),$$

where in the formula (Q), A is an A-site element primarily containing Pb, and Zr, Ti, and Nb are B-site elements. x is equal to or higher than 0.4 and lower than 1 (excluding $0.51 \leq x \leq 0.53$), and a is equal to or higher than 0.08. Although $\delta=0$ and $y=3$ are standard, $\delta$ and y may deviate from the standard values in a range in which a perovskite structure is capable of being obtained.

First, the production method of the piezoelectric film of the present invention will be described.

The production method of the piezoelectric film of the present invention is a method of forming a Nb-doped PZT thin film in which rhombohedral crystals and tetragonal crystals coexist with each other regardless of the compositional ratio between Zr and Ti using a sputtering method. In the sputtering method, ease of mixing of Zr and Ti varies between a case where a single target is used (the target composition is Nb-doped PZT) and a case where two targets (the target compositions are PZ and PT, at least one thereof is doped with Nb). In the single target, Zr and Ti are more easily mixed with each other. Therefore, the range of a power density D of the first production method of the single target has a lower high-density side upper limit than that in the range of a power density D of the second production method of the two targets. As the power density D increases, there is a tendency for Zr and Ti to be easily mixed with each other.

FIG. 1A is a view schematically illustrating a form during film formation using the sputtering method. As illustrated in FIG. 1A, a film formation gas is turned into plasma by plasma electrode discharge in a sputtering apparatus such that a plasma space P is generated. In the plasma space P, positive ions Ip of the film formation gas are generated, and the positive ions Ip sputter a target T. Constituent elements Tp of the target T sputtered by the positive ions Ip are emitted from the target T and form a film on a substrate B in a neutral or ionized state. This film formation is performed for a predetermined time, thereby forming a sputtered film having a predetermined thickness.

Figure 1B:
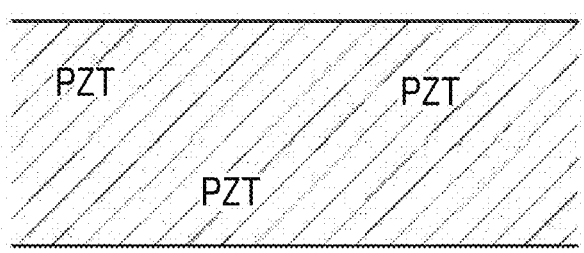
FIG. 1B is a view schematically illustrating a form of crystal phases of a piezoelectric film produced in a method in the related art.

FIG. 1B is a view schematically illustrating a form of crystal phases of a produced piezoelectric film. According to a method in the related art, a power density on the surface of a target T is higher than that in the production method of the piezoelectric film of the present invention, and deposited particles are easily mixed with each other. Therefore, a PZT film (Nb-doped PZT film) in which lead titanate (PT) and lead zirconate (PZ) are sufficiently solutionized can be obtained.

Figure 1C:
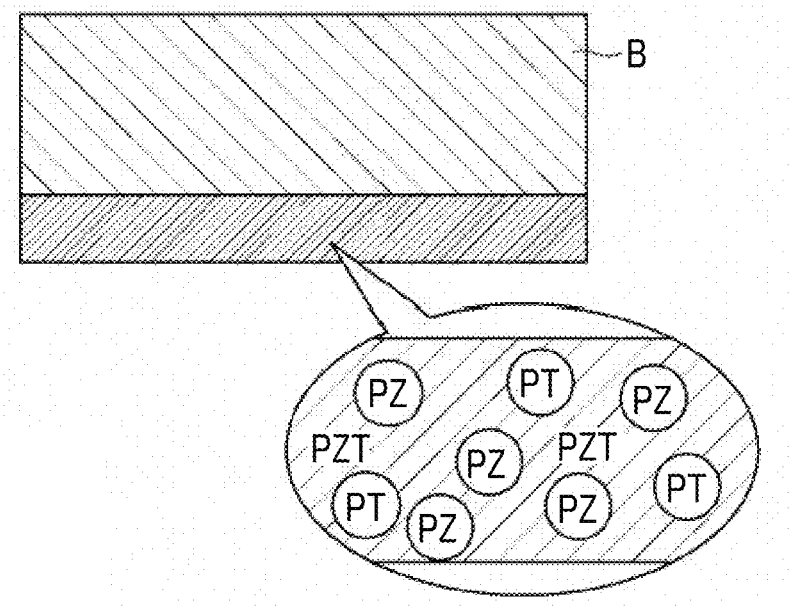
FIG. 1C is a view schematically illustrating a form of crystal phases of a piezoelectric film produced by a production method of a piezoelectric film of the present invention.

On the other hand, FIG. 1C is a view schematically illustrating a form of crystal phases of a piezoelectric film produced by the production method of the piezoelectric film of the present invention. In the production method of the piezoelectric film of the present invention, a film of Nb-doped PZT is formed under conditions in which a power density on a target is set so as to cause Zr and Ti to be less likely to be mixed with each other. Therefore, the inventors have inferred that in the formed film, PT and PZ which are not sufficiently solutionized are present respectively as tetragonal crystals and rhombohedral crystals, which are the most stable, in a film in which lead titanate and lead zirconate are solutionized to form PZT.

In the production method of the piezoelectric film of the present invention, as a target that is used, a target with a low void volume and a high target density is preferably used. As a target for PZT, a target having a target density as high as 95% to 99% is typically used in both a case of a single target and a case of two targets. In the first production method and the second production method, as the target, a target having a typical target density may be used. As the target density increases, Zr and Ti are less likely to be atomized and scatter as clusters. As a result, Zr and Ti are less likely to be mixed in the substrate, and regions with different Zr/Ti ratios are formed. Therefore, in the first production method, a target with a higher target density is preferably used.

In the production method of the piezoelectric film of the present invention, the temperature Ts of the substrate during the film formation is not particularly limited as long as the temperature Ts is in the range of the formula (2) because a perovskite oxide without a high temperature pyrochlore phase is formed. When the substrate temperature Ts is 400° C. or lower, perovskite crystal growth becomes difficult, and when the substrate temperature Ts is 750° C. or higher, a high temperature pyrochlore phase is likely to be incorporated. In order to obtain a columnar crystal film structure with good quality, Ts preferably satisfies $450 \leq Ts$ (° C.)$\leq 650$.

Figure 2:
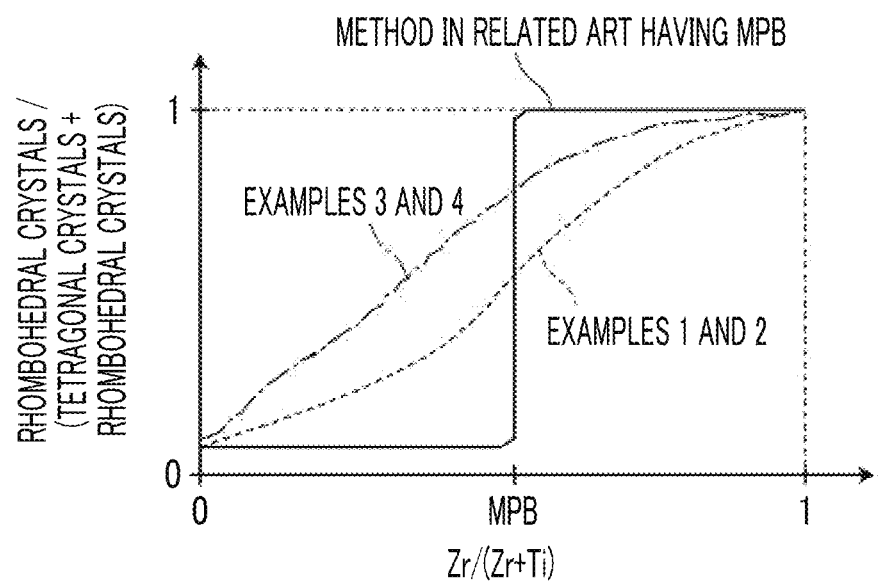
FIG. 2 is a view showing the relationship between the compositional ratio between B-site elements and the proportion of rhombohedral crystals in a Nb-doped PZT film obtained in examples and a Nb-doped PZT film obtained in the method in the related art.

FIG. 2 is a view showing the relationship between the compositional ratio between B-site elements and the proportion of rhombohedral crystals in a Nb-doped PZT film obtained in examples and a Nb-doped PZT film obtained in a method in the related art. As illustrated in FIG. 2, in the method in the related art, the Nb-doped PZT film in which tetragonal crystals are formed in a lead titanate-rich composition compared to the MPB composition and rhombohedral crystals are formed in a lead zirconate-rich composition is obtained, and a dislocation between the crystal phases occurs in the MPB composition. On the other hand, plots of results of Examples 1 and 2 and Examples 3 and 4 show that when Zr/(Zr+Ti) is in a range of 0 to 1, gentle curves are drawn and rhombohedral crystals and tetragonal crystals coexist with each other.

According to the first and second production methods of the piezoelectric film of the present invention, a Nb-doped PZT piezoelectric film represented by the following general formula (Q) can be produced.

$$A_{1+\delta}[(Zr_xTi_{1-x})_{1-a}Nb_a]O_y \quad (Q),$$

where, in the formula (Q), A is an A-site element primarily containing Pb, and Zr, Ti, and Nb are B-site elements. x is equal to or higher than 0.4 and lower than 1 (excluding $0.51 \leq x \leq 0.53$), and a is equal to or higher than 0.08. Although $\delta=0$ and $y=3$ are standard, $\delta$ and $y$ may deviate from the standard values in a range in which a perovskite structure is capable of being obtained.

In the formula (Q) and the formula (P) described later, a doping rate a of Nb in the B-site is 0.08 or higher from the viewpoint of obtaining an effect of donor doping with piezoelectric properties. Since an effect of improving piezoelectric properties is obtained as a is a higher valve, a is preferably 0.20 or higher and is preferably as high as possible in a range in which a perovskite structure is capable of being obtained.

In addition, $\delta$ is typically 0 as described above. However, since Pb is an element that is likely to be reversely sputtered and an escape of Pb from the formed piezoelectric film has an adverse effect on crystal growth, film formation is performed by setting the amount of Pb in the target to be greater than the stoichiometric composition of PZT. In this case, depending on the reverse sputtering rate of Pb, the formed film may become rich in Pb. As long as there is no hindrance to characteristics, there is no problem even when Pb deficiency exists. However, by satisfying a range of $0 \leq \delta \leq 0.2$, a perovskite oxide film with good quality and no Pb deficiency can be formed. Compositional analysis was performed on a Nb-doped PZT film obtained in examples described later through X-ray fluorescence (XRF), and a range of $0 \leq \delta \leq 0.2$ was confirmed.

In the first and second production methods of the piezoelectric film of the present invention, by controlling the substrate temperature Ts, and controlling x, which represents the proportion of Zr when the sum of Zr and Ti is assumed to be 1, to be in a range of equal to or higher than 0.4 and lower than 1 (excluding $0.51 \leq x \leq 0.53$), the rhombohedral crystals and the tetragonal crystals in the piezoelectric film can be in a range that satisfies the following formula (1).

$$0.70 \leq \text{rhombohedral crystals}/(\text{rhombohedral crystals} + \text{tetragonal crystals}) \leq 0.95 \quad (1),$$

By causing the ratio between the rhombohedral crystals and the tetragonal crystals in the piezoelectric film to be in the range that satisfies the formula (1), a Nb-doped PZT-based piezoelectric film of the present invention, which has high piezoelectric properties and causes a low degree of deterioration in piezoelectric properties during long-term operation, can be obtained.

Hereinafter, the piezoelectric film of the present invention will be described.

The piezoelectric film of the present invention is a piezoelectric film including a perovskite oxide represented by the following formula (P), in which the crystal phases of the perovskite oxide include tetragonal crystals and rhombohedral crystals at a ratio that satisfies the following formula (1).

$$A_{1+\delta}[(Zr_xTi_{1-x})_{1-a}Nb_a]O_y \quad (P)$$

$$0.70 \leq \text{rhombohedral crystals}/(\text{rhombohedral crystals} + \text{tetragonal crystals}) \leq 0.95 \quad (1),$$

where, in the formula (P), A is an A-site element primarily containing Pb, and Zr, Ti, and Nb are B-site elements. x is equal to or higher than 0.4 and lower than 1 (excluding $0.51 \leq x \leq 0.53$), and a is equal to or higher than 0.08. Although $\delta=0$ and $y=3$ are standard, $\delta$ and y may deviate from the standard values in a range in which a perovskite structure is capable of being obtained.

In the above general formula (P), $0.51 \leq x \leq 0.53$ indicates the MPB composition of so-called PZT and compositions in the vicinity thereof. Even when $0.51 \leq x \leq 0.53$ is satisfied, as long as the formula (1) is satisfied, the effects of the present invention can be obtained. However, with a composition in which x is in the above range, a piezoelectric film in which tetragonal crystals and rhombohedral crystals coexist with each other can be produced even by a method in the related art. However, the inventors have thought that even with the composition in which x is in the above range, the values of rhombohedral crystals/(rhombohedral crystals+tetragonal crystals) in the obtained piezoelectric film in the method in the related art and in the present invention are not necessarily the same.

In the above general formula (P), by causing x to be 0.5 or higher, in the range of the film formation temperature in the production method of the piezoelectric film of the present invention, a piezoelectric film that satisfies the formula (1) can be obtained.

The piezoelectric film of the present invention preferably has a columnar crystal film structure consisting of a number of columnar crystals extending in nonparallel to the substrate surface. The growth direction of the columnar crystals may be nonparallel to the substrate surface and may be either a substantially perpendicular direction or an inclined direction. In this film structure, since an oriented film with aligned crystal orientations is obtained, higher piezoelectric performance can be obtained.

The average column diameter of a number of columnar crystals constituting the piezoelectric film is not particularly limited, and is preferably 30 nm or greater and 1 μm or lower. By causing the average column diameter of the columnar crystals to be in this range, favorable crystal growth can be achieved, and a piezoelectric film which can be patterned with high accuracy can be obtained. The average column diameter of the columnar crystals mentioned here means the average value of the column diameters of all the columnar crystals in a horizontal direction at any position in a film thickness direction.

In the examples described later, by producing the piezoelectric film of the present invention, the piezoelectric properties and the rate of deterioration in the piezoelectric properties are evaluated. In the examples described later, it is described that the piezoelectric film of the present invention having a piezoelectric constant $d_{31}$ of 200 pm/V or higher and having a 20%-Nb-doped system can obtain a piezoelectric property of higher than 250 pm/V. In addition, it is described that even regarding the rate of deterioration in the piezoelectric properties, when the value of rhombohedral crystals/(rhombohedral crystals+tetragonal crystals) is higher than 0.95, the rate of deterioration increases, and by causing the value to be 0.95 or lower, deterioration in the piezoelectric properties during long-term operation can be suppressed.

As described above, the piezoelectric film of the present invention is a Nb-doped PZT-based piezoelectric film, and in compositions other than the MPB composition, rhombohedral crystals and tetragonal crystals coexist with each other at a ratio in a range of $0.70 \leq$ rhombohedral crystals/(rhombohedral crystals+tetragonal crystals) $\leq 0.95$. In this configuration, a Nb-doped PZT-based piezoelectric film which has high piezoelectric properties and causes a low degree of deterioration in piezoelectric properties during long-term operation can be obtained.

"Piezoelectric Element and Ink Jet Recording Head"

Figure 3:
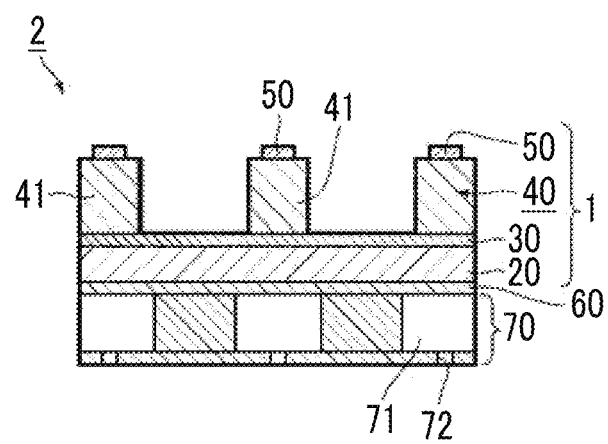
FIG. 3 is a sectional view of the structures of a piezoelectric element and an ink jet recording head (liquid discharge apparatus) of an embodiment according to the present invention.

The structures of a piezoelectric element of the embodiment according to the present invention, and an ink jet recording head (liquid discharge apparatus) including the same will be described with reference to FIG. 3. FIG. 3 is a sectional view of main parts of the ink jet recording head. For ease of viewing, the scales of the constituent elements are appropriately changed from actual scales.

A piezoelectric element (ferroelectric element) 1 of the embodiment is an element in which a lower electrode 30, a piezoelectric film 40, and an upper electrode 50 are sequentially laminated on a substrate 20, and an electric field is applied to the piezoelectric film 40 by the lower electrode 30 and the upper electrode 50 in the thickness direction. The piezoelectric film 40 is the piezoelectric film of the present invention.

The lower electrode 30 is formed on substantially the entire surface of the substrate 20, the piezoelectric film 40 having a pattern in which line-shaped protruding portions 41 extending from the front side to the rear side in the figure are arranged in a stripe shape is formed thereon, and the upper electrode 50 is formed on each of the protruding portions 41.

The pattern of the piezoelectric film 40 is not limited to the illustrated pattern and is appropriately designed. In addition, the piezoelectric film 40 may also be a continuous film. However, by forming the piezoelectric film 40 in the pattern consisting of the plurality of protruding portions 41 which are separated from each other instead of a continuous film, extension and contraction of the individual protruding portions 41 smoothly occur, and a greater displacement amount is obtained, which is preferable.

The substrate 20 is not particularly limited, and a substrate made of silicon, glass, stainless steel (SUS), yttrium-stabilized zirconia (YSZ), alumina, sapphire, or silicon carbide may be employed. As the substrate 20, a laminated substrate such as a SOI substrate in which a $SiO_2$ oxide film is formed on the surface of a silicon substrate may be used.

The primary components of the lower electrode 30 are not particularly limited, and metals or metal oxides such as Au, Pt, Ir, $IrO_2$, $RuO_2$, $LaNiO_3$, and $SrRuO_3$ and combinations thereof may be employed.

The primary components of the upper electrode 50 are not particularly limited, and the materials that exemplify the lower electrode 30, electrode materials generally used in a semiconductor process, such as Al, Ta, Cr, and Cu, and combinations thereof may be employed.

The thicknesses of the lower electrode 30 and the upper electrode 50 are not particularly limited, and for example, may be about 200 nm. The film thickness of the piezoelectric film 40 is not particularly limited, is typically 1 μm or greater, and is for example, 1 to 5 μm. The film thickness of the piezoelectric film 40 is preferably 3 μm or greater.

In the ink jet recording head (liquid discharge apparatus) 2, an ink nozzle (liquid storage and discharge member) 70 having ink chambers (liquid storage chambers) 71 that store ink and ink discharge ports (liquid discharge ports) 72 through which the ink is discharged from the ink chamber 71 to the outside is attached to substantially the lower surface of the substrate 20 of the piezoelectric element 1 having the above-described configuration via a diaphragm 60. A plurality of the ink chambers 71 are provided to correspond to the number and pattern of the protruding portions 41 of the piezoelectric film 40.

In the ink jet recording head 2, the intensity of an electric field applied to the protruding portions 41 of the piezoelectric element 1 is varied with the protruding portions 41 so as to cause the protruding portions 41 to extend and contract, such that the discharge and discharge amount of ink from the ink chambers 71 are controlled.

Instead of attaching the diaphragm 60 and the ink nozzle 70 which are members independent from the substrate 20, a portion of the substrate 20 may be processed into the diaphragm 60 and the ink nozzle 70. For example, in a case where the substrate 20 is formed as a laminated substrate such as a SOI substrate, the diaphragm 60 and the ink nozzle 70 may be formed by etching the rear surface side of the substrate 20 to form the ink chamber 71 and processing the substrate itself.

The piezoelectric element 1 and the ink jet recording head 2 of the embodiment are configured as described above.

Ink Jet Recording Device

Figure 4:
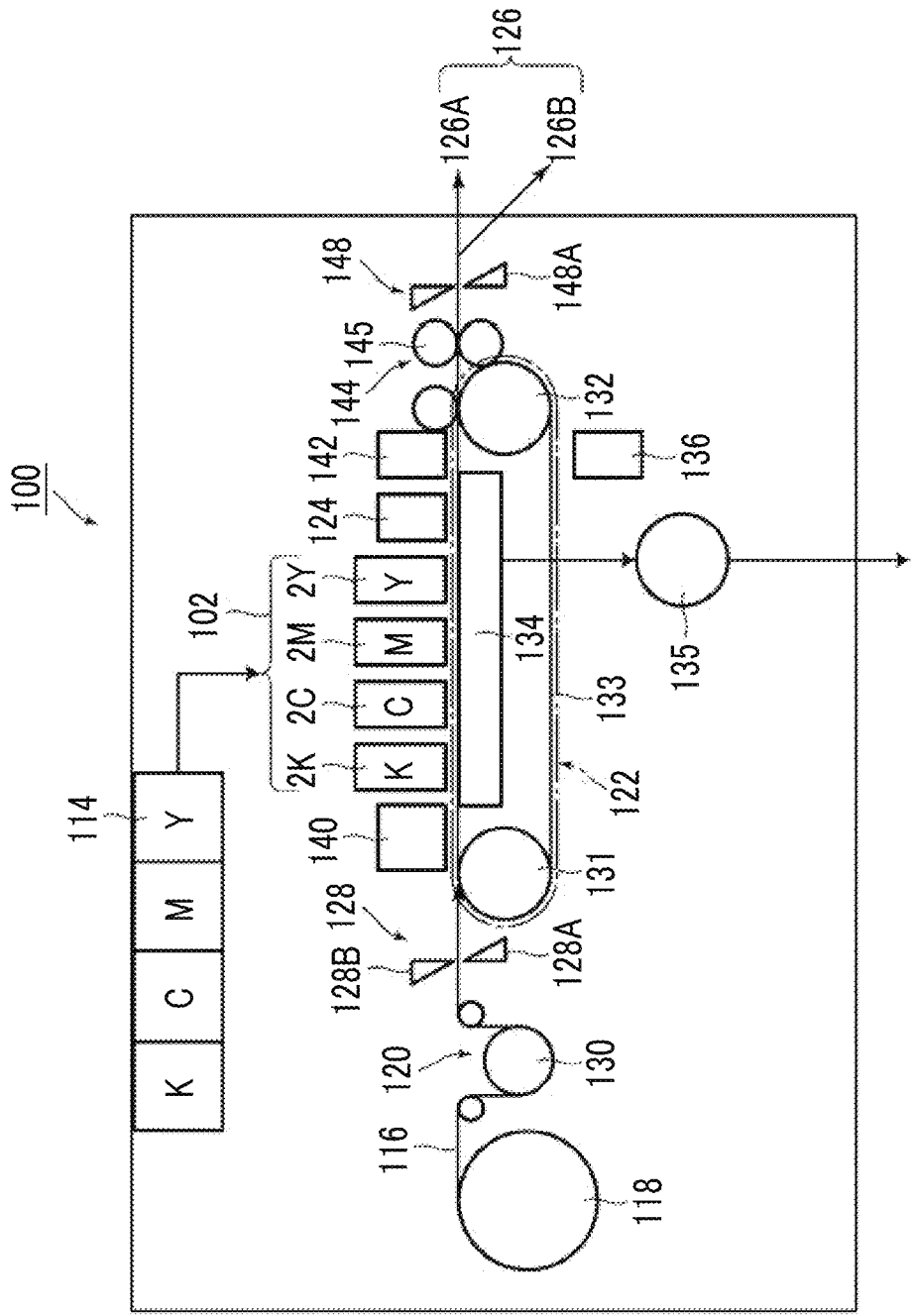
FIG. 4 is a view illustrating an example of the configuration of an ink jet recording device provided with the ink jet recording head of FIG. 3.
Figure 5:
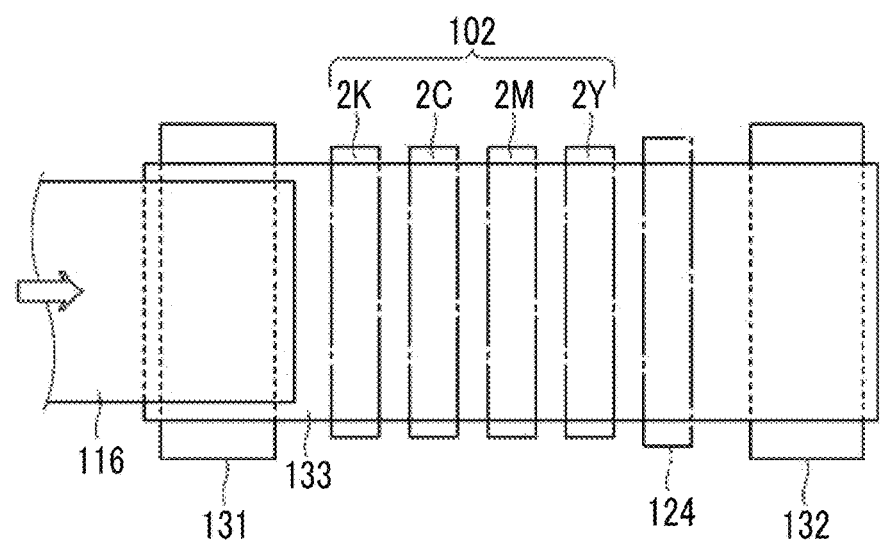
FIG. 5 is a partial top view of the ink jet recording device of FIG. 4.
Figure 6:
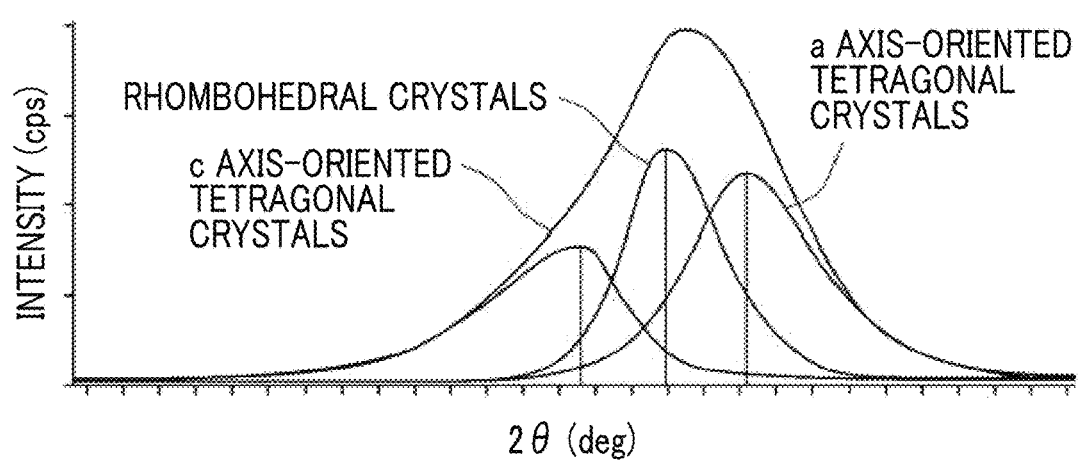
FIG. 6 is a view showing peak splitting of the Nb-doped PZT film through high-resolution X-ray diffraction (XRD).

An example of the configuration of an ink jet recording device provided with the ink jet recording head 2 of the embodiment will be described with reference to FIGS. 4 and 5. FIG. 4 is an overall view of the apparatus, and FIG. 5 is a partial top view.

An ink jet recording device 100 which is illustrated is schematically constituted by a printing unit 102 having a plurality of ink jet recording heads (hereinafter, simply referred to as "heads") 2K, 2C, 2M, and 2Y respectively provided for ink colors, an ink storage/loading unit 114 which stores ink supplied to the heads 2K, 2C, 2M, and 2Y, a sheet feeding unit 118 which feds a recording sheet 116, a decurling unit 120 which eliminates curl of the recording sheet 116, an adsorption belt transporting unit 122 which is disposed to face a nozzle surface (ink discharge surface) of the printing unit 102 and transports the recording sheet 116 while holding the flatness of the recording sheet 116, a printing detection unit 124 which reads printing results of the printing unit 102, and a discharge unit 126 which discharges the printed recording sheet (printed matter) to the outside.

Each of the heads 2K, 2C, 2M, and 2Y constituting the printing unit 102 is the ink jet recording head 2 of the embodiment.

In the decurling unit 120, heat is applied to the recording sheet 116 by a heating drum 130 in a direction opposite to the curl direction, such that decurling is performed.

In an apparatus which uses a rolled sheet, as in FIG. 4, a cutter 128 for cutting is provided at the rear stage of the decurling unit 120, and the rolled sheet is cut into a desired size by the cutter. The cutter 128 is constituted by a fixed blade 128A having a length of equal to or greater than the transporting path width of the recording sheet 116, a round blade 128B which is moved along the fixed blade 128A, the fixed blade 128A is provided on the printing back surface side, and the round blade 128B is disposed on the printing surface side with the transporting path interposed therebetween. In an apparatus which uses a cut sheet, the cutter 128 is unnecessary.

The recording sheet 116 which is decurled and cut is sent to the adsorption belt transporting unit 122. The adsorption belt transporting unit 122 has a structure in which an endless belt 133 is wound between rollers 131 and 132 and is configured so that at least a portion which faces the nozzle surface of the printing unit 102 and a sensor surface of the printing detection unit 124 is a horizontal surface (flat surface).

The belt 133 has a width dimension wider than the width of the recording sheet 116, and a number of suction holes (not illustrated) are formed on the belt surface. On the inside of the belt 133 suspended between the rollers 131 and 132, at a position at which the belt 133 faces the nozzle surface of the printing unit 102 and the sensor surface of the printing detection unit 124, an adsorption chamber 134 is provided. By suctioning the adsorption chamber 134 using a fan 135 to achieve a negative pressure, the recording sheet 116 on the belt 133 is adsorbed and held.

As power of a motor (not illustrated) of at least one of the rollers 131 and 132 around which the belt 133 is wound is transmitted, the belt 133 is driven in a clockwise direction in FIG. 4, and the recording sheet 116 held on the belt 133 is transported from the left to the right in FIG. 4.

When borderless printing is performed, ink is adhered onto the belt 133. Therefore, a belt cleaning unit 136 is provided at a predetermined position (an appropriate position excluding the printing region) on the outside of the belt 133.

On the upstream side of the printing unit 102 on the sheet transporting path formed by the adsorption belt transporting unit 122, a heating fan 140 is provided. The heating fan 140 heats the recording sheet 116 by blowing heating air toward the recording sheet 116 before being printed. Since the recording sheet 116 is heated immediately before printing, ink can be easily dried after being adhered.

The printing unit 102 is a so-called full line type head in which line type heads having a length corresponding to the maximum sheet width is disposed in a direction perpendicular to the sheet feeding direction (main scanning direction) (see FIG. 5). Each of the printing heads 2K, 2C, 2M, and 2Y is configured as a line type head in which a plurality of ink discharge ports (nozzles) are arranged to have a length greater than at least one side of the recording sheet 116 with the maximum size, which is an object of the ink jet recording device 100.

The heads 2K, 2C, 2M, and 2Y respectively corresponding to color inks are disposed in order of black (K), cyan (C), magenta (M), and yellow (Y) from the upstream side in the feeding direction of the recording sheet 116. By discharging color ink from each of the heads 2K, 2C, 2M, and 2Y while transporting the recording sheet 116, a color image is recorded on the recording sheet 116.

The printing detection unit 124 is formed as a line sensor or the like which images droplet ejection results of the printing unit 102 and detects discharge failure such as clogging of a nozzle from an image of the ejected droplets, which is read by the line sensor.

At the rear stage of the printing detection unit 124, a post-drying unit 142 which is formed as a heating fan or the like, which dries the printed image surface. Since it is preferable to avoid contact with the printed surface until the ink is dried after the printing, a heated air blowing method is preferable.

At the rear stage of the post-drying unit 142, a heating and pressurizing unit 144 is provided to control the glossiness of the image surface. In the heating and pressing unit 144, the image surface is pressed by a pressing roller 145 having predetermined surface uneven shapes while the image surface is heated, such that the uneven shapes are transferred onto the image surface.

The printed matter obtained in this manner is discharged from the discharge unit 126. It is preferable that a target image to be originally printed (a print of a target image) and a test print are separately discharged. In the ink jet recording device 100, sorting means (not illustrated) for switching between sheet discharge paths to sorting the printed matter of the original image and the printed matter of the test print to be respectively sent to discharge units 126A and 126B is provided.

In a case where the original image and the test print are simultaneously printed in parallel on a large sheet, a configuration in which a cutter 148 is provided to cut and separate a portion of the test print may be employed.

The ink jet recording device 100 is configured as described above.

(Design Change)

The present invention is not limited to the above-described embodiment, and various changes in design can be made without departing from the gist of the present invention.

EXAMPLES

Examples according to the present invention will be described.

Example 1

As a film formation substrate, a substrate with an electrode, in which a 10 nm-thick Ti adhesion layer and a 300 nm-thick Ir lower electrode were sequentially laminated on a 25 mm square silicon on insulator (SOI) substrate, was prepared. In the substrate, for evaluation of a piezoelectric constant, a region capable of being evaluated by a cantilever was provided in advance.

The substrate with an electrode was placed in an RF sputtering apparatus, and under conditions with a degree of vacuum of 0.3 Pa and an Ar/$O_2$ mixed atmosphere ($O_2$ volume fraction 2.0%), by setting the value of Zr/(Zr+Ti) in a target to 0.3, 0.4, 0.45, 0.5, 0.55, 0.58, or 0.6, setting the amount of Nb doping B-site to 8%, setting a substrate temperature to 450° C., and setting a power density D on the target to be in a range of $3.0 \leq D(W/cm^2) \leq 4.0$, film formation of a plurality of types of Nb-doped PZT piezoelectric films with a thickness of 3.0 μm different Zr/(Zr+Ti) values was performed. As the target, a single target was used.

XRD measurement was performed on each of the Nb-doped PZT films which were formed, and it was confirmed that any of the films was a (100)-oriented perovskite oxide with no pyrochlore phase and good quality.

Figure 7:
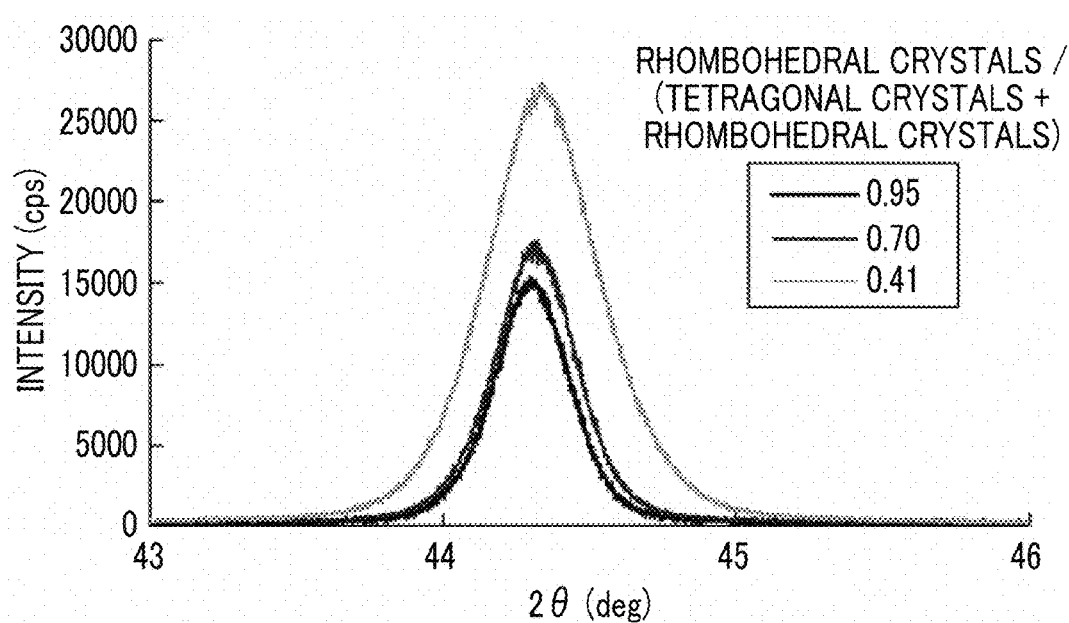
FIG. 7 shows XRD spectrums of Nb-doped PZT films obtained in Example 1.

Peak splitting of each of the Nb-doped PZT films was performed through high-resolution XRD to obtain the peak surface area of each of peaks of rhombohedral crystals and tetragonal crystals. From the obtained peak surface areas, the value of rhombohedral crystals/(rhombohedral crystals+ tetragonal crystals) of the Nb-doped PZT film was calculated. The results are shown in Table 1. In addition, FIG. 7 shows XRD results of three Nb-doped PZT films among the obtained piezoelectric films.

TABLE 1

| Zr/(Zr + Ti) | Rhombohedral crystals/(tetragonal crystals + rhombohedral crystals) |
|---|---|
| 0.30 | 0.41 |
| 0.40 | 0.44 |

TABLE 1-continued

| Zr/(Zr + Ti) | Rhombohedral crystals/(tetragonal crystals + rhombohedral crystals) |
|---|---|
| 0.45 | 0.56 |
| 0.50 | 0.70 |
| 0.55 | 0.95 |
| 0.58 | 0.97 |
| 0.60 | 1.00 |

Example 2

Film formation of a plurality of types of Nb-doped PZT piezoelectric films with different Zr/(Zr+Ti) values was performed in the same manner as in Example 1 except that the amount of Nb doping B-site was set to 20%. XRD measurement was performed on each of the Nb-doped PZT films which were formed, and it was confirmed that any of the films was a (100)-oriented perovskite oxide with no pyrochlore phase and good quality.

Peak splitting of each of the Nb-doped PZT films was performed through high-resolution XRD to obtain the peak surface area of each of peaks of rhombohedral crystals and tetragonal crystals. From the obtained peak surface areas, the value of rhombohedral crystals/(rhombohedral crystals+ tetragonal crystals) of the Nb-doped PZT film was calculated.

Comparative Example 1

Film formation of a plurality of types of PZT piezoelectric films with different Zr/(Zr+Ti) values was performed in the same manner as in Example 1 except that Nb doping was not performed. XRD measurement was performed on each of the PZT films which were formed, and it was confirmed that any of the films was a (100)-oriented perovskite oxide with no pyrochlore phase and good quality.

Peak splitting of each of the PZT films was performed through high-resolution XRD to obtain the peak surface area of each of peaks of rhombohedral crystals and tetragonal crystals. From the obtained peak surface areas, the value of rhombohedral crystals/(rhombohedral crystals+tetragonal crystals) of the PZT film was calculated. As a result, substantially the same results as those of Example 1 could be obtained.

Comparative Example 2

Film formation of a plurality of types of PZT piezoelectric films with different Zr/(Zr+Ti) values was performed in the same manner as in Example 1 except that Nb doping was not performed and the power density D on the target was set to be in a range of $5.0 \leq D(W/cm^2) \leq 6.0$. Furthermore, a PZT piezoelectric film with a value of Zr/(Zr+Ti) of 0.52 was also formed in the same manner. XRD measurement was performed on each of the PZT films which were formed, and it was confirmed that any of the films was a (100)-oriented perovskite oxide with no pyrochlore phase and good quality.

Comparative Example 3

Film formation of a plurality of types of Nb-doped PZT piezoelectric films with different Zr/(Zr+Ti) values was performed in the same manner as in Example 1 except that the power density D on the target was set to be in a range of $5.0 \leq D(W/cm^2) \leq 6.0$. Furthermore, a PZT piezoelectric film with a value of Zr/(Zr+Ti) of 0.52 was also formed in the same manner. XRD measurement was performed on each of the Nb-doped PZT films which were formed, and it was confirmed that any of the films was a (100)-oriented perovskite oxide with no pyrochlore phase and good quality.

Comparative Example 4

Film formation of a plurality of types of Nb-doped PZT piezoelectric films with different Zr/(Zr+Ti) values was performed in the same manner as in Example 2 except that the power density D on the target was set to be in a range of $5.0 \leq D(W/cm^2) \leq 6.0$. Furthermore, a PZT piezoelectric film with a value of Zr/(Zr+Ti) of 0.52 was also formed in the same manner. XRD measurement was performed on each of the Nb-doped PZT films which were formed, and it was confirmed that any of the films was a (100)-oriented perovskite oxide with no pyrochlore phase and good quality.

Regarding Comparative Examples 2 to 4, peak splitting of each of the PZT films or the Nb-doped PZT films was performed through high-resolution XRD to obtain the peak surface area of each of peaks of rhombohedral crystals and tetragonal crystals. From the obtained peak surface areas, the value of rhombohedral crystals/(rhombohedral crystals+tetragonal crystals) of the PZT film was calculated. As a result, only in the PZT piezoelectric film having a value of Zr/(Zr+Ti), which is the MPB composition, of 0.52, rhombohedral crystals and tetragonal crystals coexisted with each other, and in this composition, the value of rhombohedral crystals/(tetragonal crystals+rhombohedral crystals) was 0.56. In addition, even in a case where the value of Zr/(Zr+Ti) was 0.51 and 0.53, rhombohedral crystals and tetragonal crystals coexisted with each other, and it was confirmed that in this composition, the values of rhombohedral crystals/(tetragonal crystals+rhombohedral crystals) were 0.44 and 0.70, respectively. As a result, it was confirmed that only tetragonal crystals were formed in a composition that satisfied Zr/(Zr+Ti)<0.51, 0<rhombohedral crystals/(rhombohedral crystals+tetragonal crystals)<1 was satisfied when $0.51 \leq Zr/(Zr+Ti) \leq 0.53$ was satisfied, and only rhombohedral crystals were formed in a composition that satisfied 0.53<Zr/(Zr+Ti).

<Displacement Amount Evaluation>

Regarding Examples 1 and 2 and Comparative Examples 1 to 4, a 100 nm-thick Pt upper electrode was formed on the Nb-doped PZT film, thereby producing a piezoelectric element. By processing the cantilever formation region of each of the example into a strip shape having a width of about 2 mm and a length of about 24 mm, cantilevers were produced. In addition, the longitudinal direction of the cantilever was caused to correspond to a (110) direction of Si crystals, and the thickness direction thereof was caused to correspond to a (100) direction.

After the cantilever was fixed to cause the displaceable length of the cantilever to be about 18 mm, a sine wave drive voltage of a frequency of 1 kHz, 10 Vpp, and an offset voltage of −5 V was applied between the upper electrode and the lower electrode. A displacement amount was obtained by measuring a tip end displacement amount when the sine wave drive voltage was applied, using a laser doppler vibrometer. Vpp refers to the potential difference between the highest value and the lowest value of an AC voltage waveform.

First, using a finite element method, a resonant frequency was calculated by changing the length of the cantilever, and an effective length $L_0$ was determined by matching the resonant frequency to an actual measurement value. Next, the tip end displacement amount was calculated by setting the length $L_0$, a piezoelectric constant $d_{31}$ was obtained when the tip end displacement amount was matched to an actual measurement value, and this was determined as the piezoelectric constant of a PZT-based thin film. A structure used in the finite element method was Pt (0.3 μm)/PZT/Ir (0.3 μm)/Si, the following values were used as parameter values. In addition, since Si is an anisotropic material, a Young's modulus and a Poisson's ratio used in a simulation calculation need to correspond to the orientation of the cantilever longitudinal direction.

Si (110) orientation: Young's modulus $Y_{Si}$=169 GPa, Poisson's ratio $n_{Si}$=0.064

PZT: Young's modulus $Y_{PZT}$=50 GPa, Poisson's ratio $n_{PZT}$=0.34

Ir (lower electrode): Young's modulus $Y_{Ir}$=530 GPa, Poisson's ratio $n_{Ir}$=0.26

Pt (upper electrode): Young's modulus $Y_{Pt}$=168 GPa, Poisson's ratio $n_{Pt}$=0.39

Figure 8A:
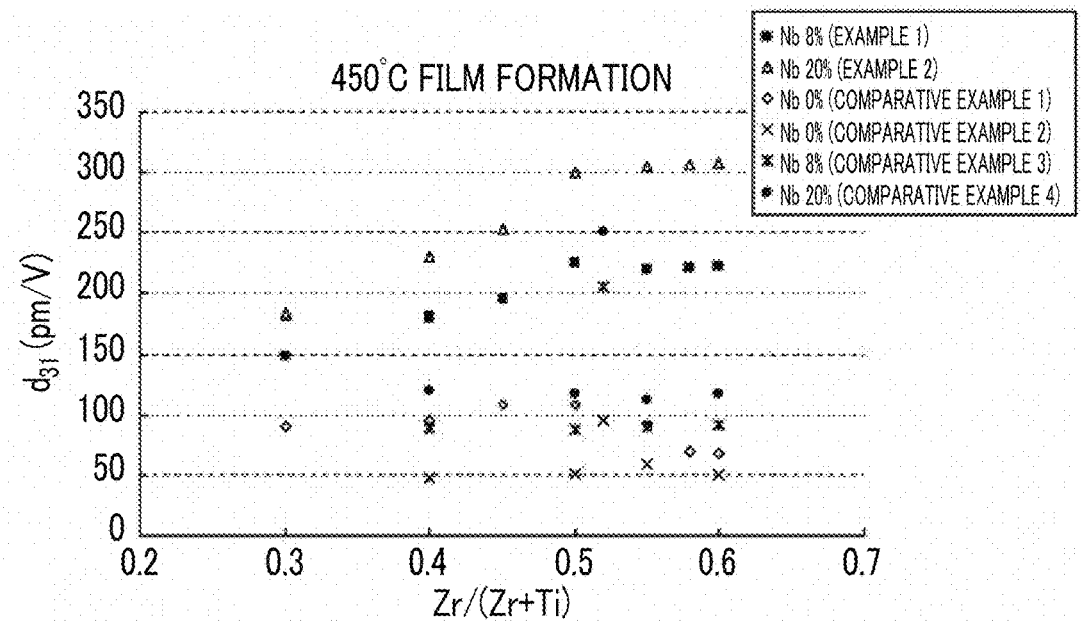
FIG. 8A is a view showing the relationship between piezoelectric properties and Zr/(Zr+Ti) of examples and comparative examples in a case where a substrate temperature is set to 450° C.
Figure 8B:
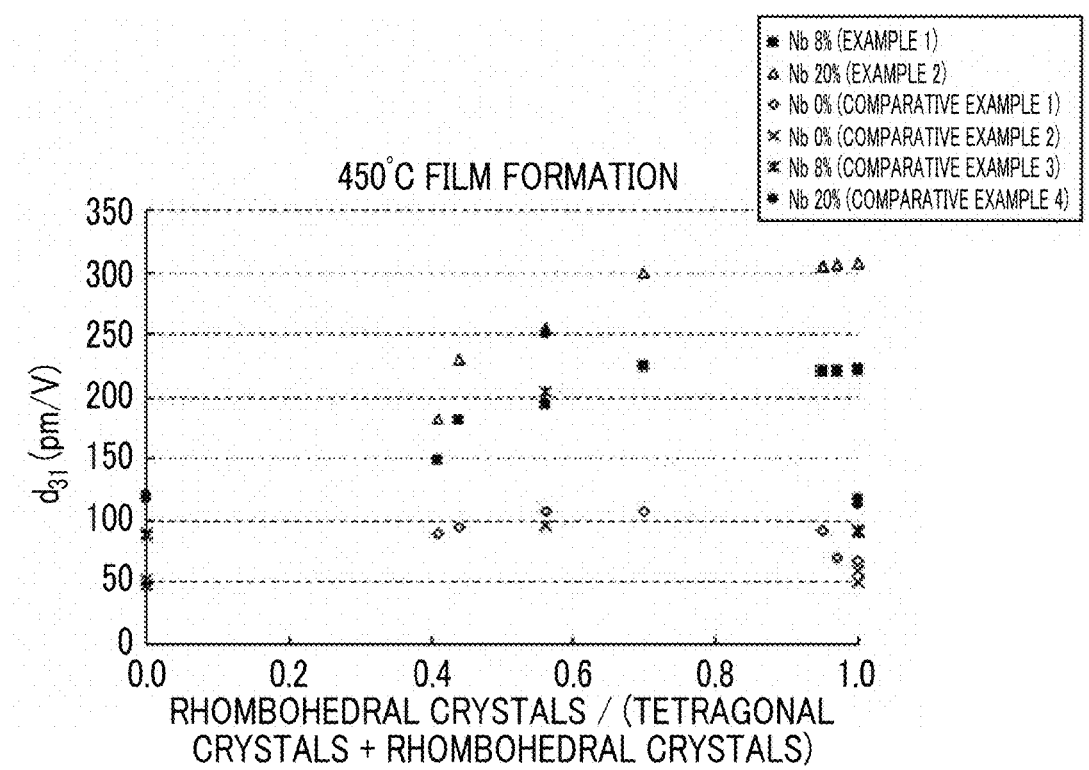
FIG. 8B is a view showing the relationship between piezoelectric properties and the ratio between crystal phases of the examples and the comparative examples in the case where the substrate temperature is set to 450° C.

FIG. 8A shows the relationship between the value of Zr/(Zr+Ti) of each example and the piezoelectric constant $d_{31}$, and FIG. 8B shows the relationship between the value of rhombohedral crystals/(tetragonal crystals+rhombohedral crystals) of each example and the piezoelectric constant $d_{31}$.

In FIGS. 8A and 8B, it was confirmed that in Examples 1 and 2, in a region that satisfied 0.70≤rhombohedral crystals/(tetragonal crystals+rhombohedral crystals), the piezoelectric constant showed the highest value. Contrary to this, in comparative examples in which film formation was performed in a method in the related art, rhombohedral crystals and tetragonal crystals coexisted with each other only when the value Zr/(Zr+Ti), which is the MPB composition, was 0.52. In this composition, the value of rhombohedral crystals/(tetragonal crystals+rhombohedral crystals) was 0.56, and the highest piezoelectric constant was shown.

Example 3

Film formation of a plurality of types of Nb-doped PZT piezoelectric films with different Zr/(Zr+Ti) values was performed in the same manner as in Example 1 except that the substrate temperature was set to 500° C. and the value of Zr/(Zr+Ti) in the target was set to 0.25, 0.30, 0.35, 0.40, 0.45, 0.5, or 0.55. XRD measurement was performed on each of the Nb-doped PZT films which were formed, and it was confirmed that any of the films was a (100)-oriented perovskite oxide with no pyrochlore phase and good quality.

Peak splitting of each of the Nb-doped PZT films was performed through high-resolution XRD to obtain the peak surface area of each of peaks of rhombohedral crystals and tetragonal crystals. From the obtained peak surface areas, the value of rhombohedral crystals/(rhombohedral crystals+tetragonal crystals) of the Nb-doped PZT film was calculated. The results are shown in Table 2.

TABLE 2

| Zr/(Zr + Ti) | Rhombohedral crystals/(tetragonal crystals + rhombohedral crystals) |
|---|---|
| 0.25 | 0.33 |
| 0.30 | 0.39 |
| 0.35 | 0.54 |
| 0.40 | 0.70 |
| 0.45 | 0.95 |
| 0.50 | 0.97 |
| 0.55 | 1.00 |

Example 4

Film formation of a plurality of types of Nb-doped PZT piezoelectric films with different Zr/(Zr+Ti) values was performed in the same manner as in Example 3 except that the amount of Nb doping B-site was set to 20%. XRD measurement was performed on each of the Nb-doped PZT films which were formed, and it was confirmed that any of the films was a (100)-oriented perovskite oxide with no pyrochlore phase and good quality.

Peak splitting of each of the Nb-doped PZT films was performed through high-resolution XRD to obtain the peak surface area of each of peaks of rhombohedral crystals and tetragonal crystals. From the obtained peak surface areas, the value of rhombohedral crystals/(rhombohedral crystals+tetragonal crystals) of the Nb-doped PZT film was calculated.

Comparative Example 5

Film formation of a plurality of types of PZT piezoelectric films with different Zr/(Zr+Ti) values was performed in the same manner as in Example 3 except that Nb doping was not performed. XRD measurement was performed on each of the PZT films which were formed, and it was confirmed that any of the films was a (100)-oriented perovskite oxide with no pyrochlore phase and good quality.

Peak splitting of each of the PZT films was performed through high-resolution XRD to obtain the peak surface area of each of peaks of rhombohedral crystals and tetragonal crystals. From the obtained peak surface areas, the value of rhombohedral crystals/(rhombohedral crystals+tetragonal crystals) of the PZT film was calculated.

Comparative Example 6

Film formation of a plurality of types of PZT piezoelectric films with different Zr/(Zr+Ti) values was performed in the same manner as in Example 3 except that Nb doping was not performed and the power density D on the target was set to be in a range of $5.0 \leq D(W/cm^2) \leq 6.0$. Furthermore, a PZT piezoelectric film with a value of Zr/(Zr+Ti) of 0.52 was also formed in the same manner. XRD measurement was performed on each of the PZT films which were formed, and it was confirmed that any of the films was a (100)-oriented perovskite oxide with no pyrochlore phase and good quality.

Comparative Example 7

Film formation of a plurality of types of Nb-doped PZT piezoelectric films with different Zr/(Zr+Ti) values was performed in the same manner as in Example 3 except that the power density D on the target was set to be in a range of $5.0 \leq D(W/cm^2) \leq 6.0$. Furthermore, a Nb-doped PZT piezoelectric film with a value of Zr/(Zr+Ti) of 0.52 was also formed in the same manner. XRD measurement was performed on each of the Nb-doped PZT films which were formed, and it was confirmed that any of the films was a (100)-oriented perovskite oxide with no pyrochlore phase and good quality.

Comparative Example 8

Film formation of a plurality of types of Nb-doped PZT piezoelectric films with different Zr/(Zr+Ti) values was performed in the same manner as in Example 4 except that the power density D on the target was set to be in a range of $5.0 \leq D(W/cm^2) \leq 6.0$. Furthermore, a Nb-doped PZT piezoelectric film with a value of Zr/(Zr+Ti) of 0.52 was also formed in the same manner. XRD measurement was performed on each of the Nb-doped PZT films which were formed, and it was confirmed that any of the films was a (100)-oriented perovskite oxide with no pyrochlore phase and good quality.

Regarding Comparative Examples 6 to 8, peak splitting of each of the PZT films or the Nb-doped PZT films was performed through high-resolution XRD to obtain the peak surface area of each of peaks of rhombohedral crystals and tetragonal crystals. From the obtained peak surface areas, the value of rhombohedral crystals/(rhombohedral crystals+tetragonal crystals) of the PZT film was calculated. As a result, in the PZT piezoelectric film having a value of Zr/(Zr+Ti), which is the MPB composition, of 0.52, rhombohedral crystals and tetragonal crystals coexisted with each other, and in this composition, the value of rhombohedral crystals/(tetragonal crystals+rhombohedral crystals) was 0.60. In addition, even in a case where the value of Zr/(Zr+Ti) was 0.51 and 0.53, rhombohedral crystals and tetragonal crystals coexisted with each other, and it was confirmed that in this composition, the values of rhombohedral crystals/(tetragonal crystals+rhombohedral crystals) were 0.45 and 0.80, respectively. As a result, it was confirmed that only tetragonal crystals were formed in a composition that satisfied Zr/(Zr+Ti)<0.51, 0<rhombohedral crystals/(rhombohedral crystals+tetragonal crystals)<1 was satisfied when $0.51 \leq Zr/(Zr+Ti) \leq 0.53$ was satisfied, and only rhombohedral crystals were formed in a composition that satisfied 0.53<Zr/(Zr+Ti).

<Displacement Amount Evaluation>

Regarding Examples 3 and 4 and Comparative Examples 5 to 8, an upper electrode was formed in the same manner as in Example 1. A sine wave drive voltage of a frequency of 1 kHz, 10 Vpp, and an offset voltage of −5 V was applied to the cantilever formation point of the piezoelectric film of each example, thereby evaluating displacement and measuring the piezoelectric constant $d_{31}$.

Figure 9A:
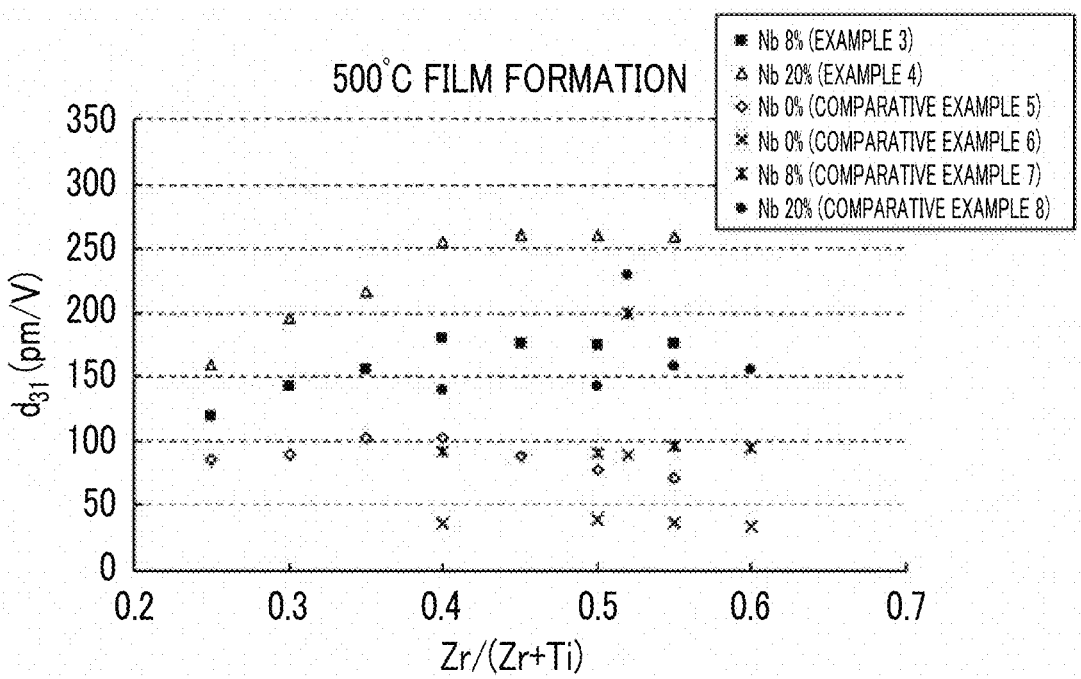
FIG. 9A is a view showing the relationship between piezoelectric properties and Zr/(Zr+Ti) of the examples and the comparative examples in a case where the substrate temperature is set to 500° C.
Figure 9B:
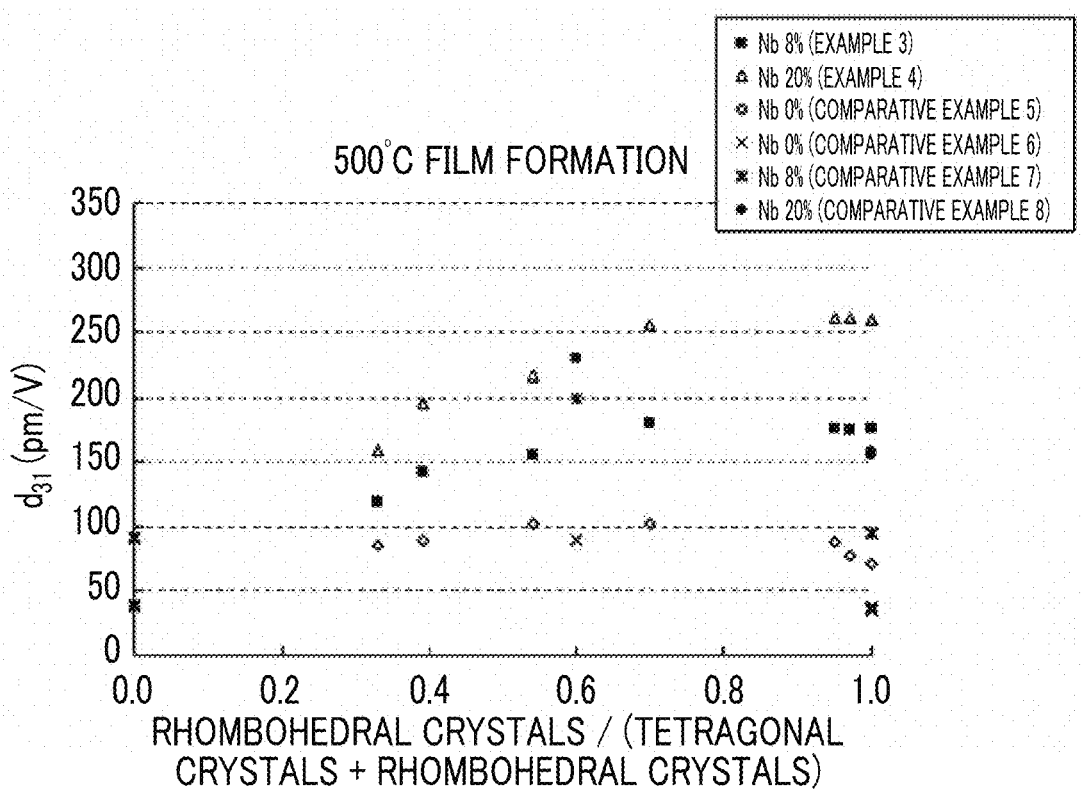
FIG. 9B is a view showing the relationship between piezoelectric properties and the ratio between crystal phases of the examples and the comparative examples in the case where the substrate temperature is set to 500° C.

FIG. 9A shows the relationship between the value of Zr/(Zr+Ti) of each example and the piezoelectric constant $d_{31}$, and FIG. 9B shows the relationship between the value of rhombohedral crystals/(tetragonal crystals+rhombohedral crystals) of each example and the piezoelectric constant $d_{31}$.

In FIGS. 9A and 9B, it was confirmed that in Examples 3 and 4, in a region that satisfied 0.70≤rhombohedral crystals/(tetragonal crystals+rhombohedral crystals), the piezoelectric constant showed the highest value. Contrary to this, in comparative examples in which film formation was performed in a method in the related art, rhombohedral crystals and tetragonal crystals coexisted with each other only when the value Zr/(Zr+Ti), which is the MPB composition, was 0.52. In this composition, the value of rhombohedral crystals/(tetragonal crystals+rhombohedral crystals) was 0.60, and the highest piezoelectric constant was shown.

From the results of Tables 1 and 2, it was confirmed that as the substrate temperature increased, the proportion of rhombohedral crystals in a composition with a small amount of Zr increased. Although the reason for this is not clear, it is thought that this is because as the substrate temperature increases, the crystal axis is inclined, and as a result, rhombohedral crystals are stably formed.

In addition, in comparison between FIGS. 8A, 8B, 9A, and 9B, it was confirmed that in FIGS. 8A and 8B with a lower substrate temperature, a higher piezoelectric constant was obtained. Although the reason for this is not clear, it is assumed that while the peak of pyrochlore phases was not observed in Examples 3 and 4, pyrochlore phases are likely to be formed as the substrate temperature increases.

<Deterioration Rate Due to Continuous Operation>

Regarding the Nb-doped PZT films of Examples 1 to 4, the deterioration rate of the piezoelectric constant after a continuous operation for 100 hours was measured. The results are shown in Tables 3 and 4. The deterioration rate in the tables is a value calculated on the basis of a piezoelectric constant immediately before the start of the continuous operation. In any of the tables, it is shown that when the value of rhombohedral crystals/(tetragonal crystals+rhombohedral crystals) is higher than 0.95, the deterioration rate increases. It is thought that this is because from the viewpoint of film deterioration during a continuous operation, film deterioration can be further suppressed when different structures are included than when a configuration having only rhombohedral crystals is formed.

TABLE 3

| Peak surface area ratio Rhombohedral crystals/ (rhombohedral crystals + tetragonal crystals) | Deterioration rate of piezoelectric constant | |
|---|---|---|
| | 8% Nb-doped PZT | 20% Nb-doped PZT |
| 0.41 | 1 | 1 |
| 0.44 | 1 | 1 |
| 0.56 | 1 | 1 |
| 0.70 | 2 | 2 |
| 0.95 | 2 | 2 |
| 0.97 | 8 | 9 |
| 1.00 | 12 | 14 |

TABLE 4

| Peak surface area ratio Rhombohedral crystals/ (rhombohedral crystals + tetragonal crystals) | Deterioration rate of piezoelectric constant | |
|---|---|---|
| | 8% Nb-doped PZT | 20% Nb-doped PZT |
| 0.33 | 1 | 1 |
| 0.39 | 1 | 1 |
| 0.54 | 1 | 1 |
| 0.70 | 2 | 2 |
| 0.95 | 2 | 2 |
| 0.97 | 7 | 8 |
| 1.00 | 12 | 13 |

The piezoelectric film of the present invention can be preferably used in an ink jet recording head, a magnetic recording and reproducing head, a microelectromechanical systems (MEMS) device, a micropump, a piezoelectric actuator mounted in an ultrasound probe, and a ferroelectric element such as a ferroelectric memory.

What is claimed is:

1. A piezoelectric film comprising: a perovskite oxide represented by the following formula (P),
   wherein crystal phases of the perovskite oxide include tetragonal crystals and rhombohedral crystals at a ratio that satisfies the following formula (1), $$A_{1+\delta}[(Zr_xTi_{1-x})_{1-a}Nb_a]O_y \qquad (P)$$

$$0.70 \leq \text{rhombohedral crystals}/(\text{rhombohedral crystals}+\text{tetragonal crystals}) \leq 0.95 \qquad (1),$$

where, in the formula (P), A is an A-site element primarily containing Pb, and Zr, Ti, and Nb are B-site elements, x is equal to or higher than 0.4 and lower than 1, excluding x of equal to or higher than 0.51 and equal to or lower than 0.53, a is equal to or higher than 0.08, and $\delta=0$ and $y=3$ are standard in which $\delta$ and y may deviate from standard values in a range in which a perovskite structure is capable of being obtained.

2. The piezoelectric film according to claim 1, wherein x is higher than 0.5.

3. The piezoelectric film according to claim 1, wherein the piezoelectric film is a columnar crystal film consisting of a number of columnar crystals.

4. A piezoelectric element comprising:
the piezoelectric film according to claim 1; and
an electrode which applies an electric field to the piezoelectric film.

5. A liquid discharge apparatus comprising:
the piezoelectric element according to claim 4; and
a liquid discharge member which is provided integrally with or separately from the piezoelectric element,
wherein the liquid discharge member has a liquid storage chamber which stores a liquid, and a liquid discharge port through which the liquid is discharged from the liquid storage chamber to the outside.

* * * * *